US007928856B2

(12) United States Patent
Jacubovski et al.

(10) Patent No.: US 7,928,856 B2
(45) Date of Patent: Apr. 19, 2011

(54) METHOD OF SAMPLING A MODULATED SIGNAL DRIVEN CHANNEL

(75) Inventors: Migel Jacubovski, Hod Hasharon (IL); Alon Ferentz, Bat Yam (IL); Roni Blaut, Netanya (IL)

(73) Assignee: Microsemi Corp. -Analog Mixed Signal Group Ltd., Hod Hasharon (IL)

( * ) Notice: Subject to any disclaimer, the term of this patent is extended or adjusted under 35 U.S.C. 154(b) by 432 days.

(21) Appl. No.: 12/170,448

(22) Filed: Jul. 10, 2008

(65) Prior Publication Data

US 2009/0021384 A1 Jan. 22, 2009

Related U.S. Application Data

(60) Provisional application No. 60/950,122, filed on Jul. 17, 2007.

(51) Int. Cl.

| | |
|---|---|
| ***G08B 21/00*** | (2006.01) |
| *G01R 31/02* | (2006.01) |
| *H05B 37/00* | (2006.01) |
| *G05F 1/00* | (2006.01) |

(52) U.S. Cl. ........ 340/653; 340/635; 324/537; 315/312; 315/291; 315/152

(58) Field of Classification Search .................. 340/635, 340/653; 324/537
See application file for complete search history.

(56) References Cited

U.S. PATENT DOCUMENTS

| | | | | |
|---|---|---|---|---|
| 7,317,403 | B2 * | 1/2008 | Grootes et al. | 340/815.45 |
| 7,605,550 | B2 * | 10/2009 | Ferentz et al. | 315/312 |
| 7,812,297 | B2 * | 10/2010 | Blaut et al. | 250/205 |
| 2005/0212459 | A1 | 9/2005 | Patel et al. | |
| 2007/0159421 | A1 * | 7/2007 | Peker et al. | 345/82 |
| 2007/0182701 | A1 | 8/2007 | Kim et al. | |
| 2007/0195025 | A1 | 8/2007 | Korcharz et al. | |
| 2008/0018267 | A1 | 1/2008 | Arakawa et al. | |
| 2009/0189530 | A1 * | 7/2009 | Ashdown et al. | 315/152 |

* cited by examiner

*Primary Examiner* — George A Bugg
*Assistant Examiner* — Jack Wang
(74) *Attorney, Agent, or Firm* — Simon Kahn

(57) ABSTRACT

An automated method of sampling an electrical condition of each of a plurality channels, the method comprising: driving each of the plurality of channels with a modulated signal; providing a settable flag associated with each of the plurality of channels; selecting one of the plurality of channels; identifying if the settable flag associated with the selected one of the plurality of channels is set; and in the event that the settable flag associated with the selected one of the plurality of channels is not set, and a function of the modulated signal of the selected one of the plurality of channels is active and stable: sampling an electrical condition of the selected one of the plurality of channels; and setting the provided settable flag associated with the selected one of the plurality of channels.

19 Claims, 3 Drawing Sheets

METHOD OF SAMPLING A MODULATED SIGNAL DRIVEN CHANNEL

CROSS-REFERENCE TO RELATED APPLICATIONS

This application claims priority from U.S. Provisional Patent Application Ser. No. 60/950,122 filed Jul. 17, 2007, entitled "Method of Sampling a Modulated Signal Driven Channel", the entire contents of which are incorporated herein by reference.

TECHNICAL FIELD

The invention relates to the field of control systems and in particular to a method of sampling and controlling a plurality of pulse density modulated signals, preferably pulse width modulated signals.

BACKGROUND

Light emitting diodes (LEDs) and in particular high intensity and medium intensity LED strings are rapidly coming into wide use for lighting applications. LEDs with an overall high luminance are useful in a number of applications including, but not limited to, backlighting for liquid crystal display (LCD) based monitors and televisions, collectively hereinafter referred to as monitors. In a large monitor the LEDs are typically supplied in one or more strings of serially connected LEDs, thus sharing a common current.

In order to supply a white backlight for the monitor, one of two basic techniques are commonly used. In a first technique one or more strings of "white" LEDs are utilized, the white LEDs typically comprising a blue LED with a phosphor which absorbs the blue light emitted by the LED and emits a white light. In a second technique, one or more individual strings of colored LEDs are placed in proximity so that in combination their light is seen as a white light. Often, two strings of green LEDs are utilized to balance one string each of red and blue LEDs.

In either of the two techniques, the strings of LEDs are in one embodiment located at one end or one side of the monitor, the light being diffused to appear behind the LCD by a diffuser. In another embodiment the LEDs are located directly behind the LCD, the light being diffused by a diffuser so as to avoid the appearance of hot spots. In the case of colored LEDs, a further mixer is required, which may be part of the diffuser, to ensure that the light of the colored LEDs are not viewed separately, but are rather mixed to give a white light. The white point of the light is an important factor to control, and much effort in design and manufacturing is centered on the need for a controlled white point.

Each of the colored LED strings is typically controlled by both amplitude modulation (AM) and pulse density modulation (PDM), typically by pulse width modulation (PWM), PWM being a particular embodiment of PDM, to achieve an overall fixed perceived luminance and white point. AM is typically used to set the white point produced by the disparate colored LED strings by setting the constant current flow through the LED strings to a value determined as part of a white point calibration process and PWM is typically used to variably control the overall luminance, or brightness, of the monitor without affecting the white point balance. Thus the current, when pulsed on, is held constant to maintain the white point produced by the combination of disparate colored LED strings, and the PWM duty cycle, i.e. the percentage of the PWM period for which the PWM signal is active, is controlled to dim or brighten the backlight by adjusting the average current over time. The PWM duty cycle of each color is further modified to maintain the white point, preferably responsive to a color sensor. It is to be noted that different colored LEDs age, or reduce their luminance as a function of current, at different rates and thus the PWM duty cycle of each color must be modified over time to maintain the white point. Thus, LED strings of various colors, which may be controlled by a single controller, will over time typically exhibit differing PWM duty cycles.

Each of the disparate colored LED strings has a voltage requirement associated with the forward voltage drop of the LEDs and the number of LEDs in the LED string. In the event that multiple LED strings of each color are used, the voltage drop across strings of the same color having the same number of LEDs per string may also vary due to manufacturing tolerances and temperature differences. Ideally, separate power sources are supplied for each LED string, the power sources being adapted to adjust their voltage output to be in line with voltage drop across the associated LED string. Such a large plurality of power sources effectively minimizes excess power dissipation; however the requirement for a large plurality of power sources is costly.

An alternative solution, which reduces the number of power sources required, is to supply a single power source for each color. Thus a plurality of LED strings of a single color is driven by a single power source, and the number of power sources required is reduced to the number of different colors, i.e. typically to 3. Unfortunately, since as indicated above, different LED strings of the same color may exhibit different voltage drops, such a solution further requires an active element in series with each LED string to compensate for the differing voltage drops so as to ensure an essentially equal current through each of the LED strings of the same color.

One known problem of LCD matrix displays is motion blur. One cause of motion blur is that the response time of the LCD is finite. Thus, there is a delay from the time of writing to the LCD pixel until the image changes. Furthermore, since each pixel is written once per frame, and is then held until the next frame, smooth motion is not possible. The eye notices the image being in the wrong place until the next sample, and interprets this as blur or smear.

This problem is addressed by a scanning backlight, in which the matrix display is divided into a plurality of regions, or zones, and the backlight for each zone is illuminated for a short period of time in synchronization with the writing of the image. Ideally, the backlighting for the zone is illuminated just after the pixel response time, and the illumination is held for a predetermined illumination frame time whose timing is associated with the particular zone. Thus, the display is only illuminated for a short period of time and is not senses as being in the wrong place.

An additional known problem of LCD monitors is the lack of contrast, and in particular in the presence of ambient light. An LCD monitor operates by providing two linear polarizers whose orientation in relation to each other is adjustable. If the linear polarizers are oriented orthogonally to each other, light from the backlight is prevented from being transmitted in the direction of the viewer. If the linear polarizers are aligned, the maximum amount of light is transmitted in the direction of the viewer. Unfortunately, a certain amount of light leakage occurs when the polarizers are oriented orthogonally to each other, thus reducing the overall contrast.

This problem is addressed by adding dynamic capability to the scanning backlight, the dynamic capability adjusting at least one of the overall luminance and the white point of the backlight for each zone responsive to the video signal. Thus, in the event of a dark scene, the backlight luminance is reduced thereby improving the contrast.

The addition of dynamic and scanning capability adds to complexity, and may result in certain LED strings of a particular color exhibiting a PWM duty rate different from other LED strings of the same color. Thus, each LED string controlled by a particular controller may exhibit a particular PWM duty rate unrelated to the PWM duty rate of another LED string controlled thereby.

U.S. patent application Ser. No. 11,676,313, filed Feb. 19, 2007 in the name of Korcharz et al, entitled "Voltage Controlled Backlight Driver", the entire contents of which is incorporated by reference, is addressed to a system and method for controlling the output voltage of a power supply driving a plurality of LED strings, each of which is driven by a particular PWM signal. Such a system and method is preferably supported by a method and system for rapidly and consistently sampling the current through each of the plurality of LED strings and/or the voltage across each of the current limiters associated with the LED strings. It is to be understood that sampling the current and/or voltage, typically via an analog to digital (A/D) converter, takes a predetermined period of time, and a PWM channel, such as a LED string, is only active during a portion of a PWM period, the ratio of the active portion period to the total PWM period being denoted the PWM duty cycle.

The above mentioned application further discloses detecting an error condition of the LED strings, such as a short circuit, responsive to the sampling. Such an error detection is preferably supported by a method and system for rapidly sampling the current through each of the plurality of LED strings and/or the voltage drop across each of the current limiters associated with the LED strings when the PWM signal is active so as to rapidly detect a full or partial short circuit condition prior to burn out of one or more of the current limiters or damage to other circuit elements.

SUMMARY

In view of the discussion provided above and other considerations, the present disclosure provides methods and apparatus to overcome some or all of the disadvantages of prior and present methods of sampling and controlling a plurality of pulse density modulated signals. Other new and useful advantages of the present methods and apparatus will also be described herein and can be appreciated by those skilled in the art.

Embodiments hereof provide a method and system for rapidly sampling an electrical condition of each of a plurality of independent PWM driven channels. Identifiers of the PWM driven channels are arranged in a queue and polling is done in a round robin of the queue. A plurality of settable flags, each associated with a particular PWM driven channel, is defined and a pointer is set to the first channel in the queue.

Prior to sensing the electrical condition of a particular channel in the queue, the status of the both the respective settable flag and the PWM driving signal is checked. In the event that the settable flag is not set, i.e. the PWM channel has not been sampled, the driving signal is active and the channel is stable, i.e. current is flowing stably through the PWM channel, the electrical condition is sampled and the respective settable flag is set. In the event that either the settable flag is set, i.e. the PWM channel has been sampled, the driving signal is not active, or the current is not stably flowing through the PWM channel, the channel is skipped and the next channel in the queue, for which the settable flag is not set and the PWM signal is active and the channel is stable, is sampled.

Thus, an active stable PWM channel is quickly found and sampled, avoiding a situation of starvation of certain PWM channels when all PWM channels exhibit small duty cycles occurring at the same, or nearly the same, time. The routine continues until all channels in the queue have been sampled and the respective settable flags have all been set. The settable flags are then all cleared, and the pointer is reset to the first channel in the queue.

Additional features and advantages will become apparent from the following drawings and description.

BRIEF DESCRIPTION OF THE DRAWINGS

For a better understanding, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of certain embodiments only. In this regard, no attempt is made to show structural details in more detail than is necessary for a fundamental understanding, the description taken with the drawings making apparent to those skilled in the art how the several forms may be embodied in practice. In the accompanying drawings.

DETAILED DESCRIPTION

Figure 1:
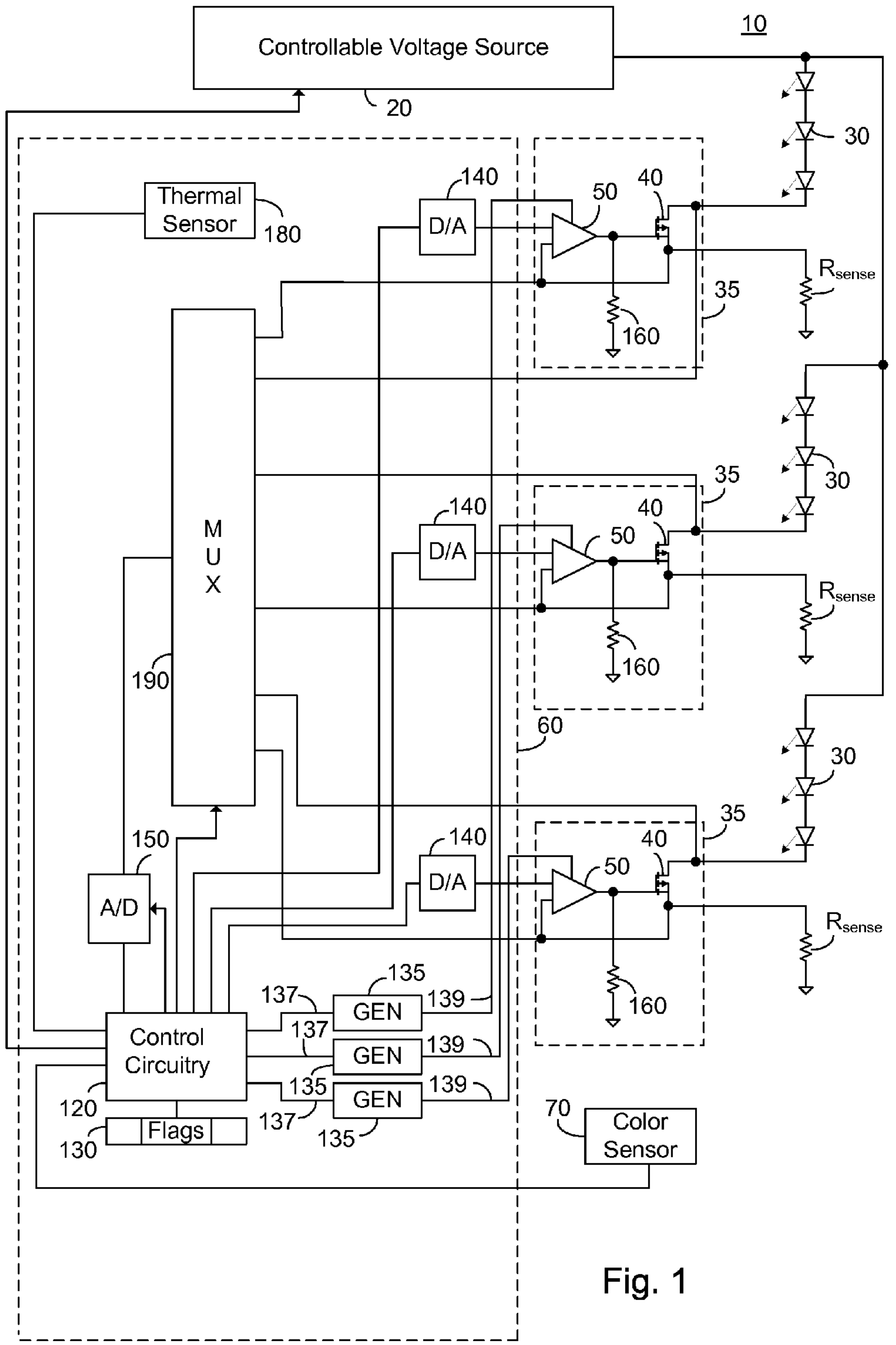
FIG. 1 illustrates a high level block diagram of an LED backlighting system according to an exemplary embodiment.

Embodiments hereof enable a method and system for rapidly and consistently sampling an electrical condition of each of a plurality of independent PWM driven channels. Identifiers of the PWM driven channels are arranged in a queue and polling is done in a round robin of the queue. A plurality of settable flags, each associated with a particular PWM driven channel, is defined and a pointer is set to the first channel in the queue.

Prior to sensing the electrical condition of a particular channel in the queue, the status of the both the respective settable flag and the PWM driving signal is checked. In the event that the settable flag is not set, and the driving signal is active, and preferably the channel is stable, the electrical condition of the channel is sampled and the respective settable flag is set. In the event that either the settable flag is set or the driving signal and resultant channel is not active and stable, the channel is skipped and the next channel in the queue, for which the settable flag is not set and the PWM signal is active and the channel is stable, is sampled. Thus, an active stable PWM channel is quickly found and sampled.

Before explaining at least one embodiment in detail, it is to be understood that the invention is not limited in application to the details of construction and the arrangement of the components set forth in the following description or illustrated in the drawings. The invention is applicable to being practiced or carried out in various ways. Also, it is to be understood that the phraseology and terminology employed herein is for the purpose of description and should not be regarded as limiting.

FIG. 1 illustrates a high level block diagram of an embodiment of a LED backlighting system 10 comprising a controllable voltage source 20; a plurality of LED strings 30; a plurality of current limiters and LED string drivers 35, each associated with a respective LED string 30; a LED string controller 60; a plurality of sense resistors $R_{sense}$, each associated with a respective LED string 30; and a color sensor 70. Each current limiter and LED string driver 35 comprises an FET 40, a comparator 50 and a pull down resistor 160. LED string controller 60 comprises: a control circuitry 120; a plurality of settable flags 130 each associated with a respective LED string 30; a plurality of modulated signal generators, preferably PDM signal generators, further preferably PWM signal generators 135 each outputting a respective stability signal 137 and a respective PWM signal 139, each of the respective LED strings 30 being associated with a particular PWM signal 139; a plurality of digital to analog (D/A) converters 140 each associated with a respective LED string 30; an analog to digital (A/D) converter 150; a thermal sensor 180; and a multiplexer 190. It is to be understood that in certain embodiments all or part of each of current limiters and LED string drivers 35 are constituted within LED string controller 60.

PWM signal generators 135 preferably each comprise a pulse width modulator in communication with control circuitry 120, and responsive thereto, operative to pulse width modulate the constant current through the respective LED string 30 via respective PWM signal 139. Preferably, PWM signal generators 135 each further output to control circuitry 120 stability signal 137 as will be described further hereinto below. Each current limiter and LED string driver 35 is associated with, and responsive to, a particular PWM signal 139 output by a respective PWM signal generator 135, however this is not meant to be limiting in any way. In one embodiment each current limiter and LED string driver 35 may be connected via switchable settings to any of the plurality of PWM signal generators 135, and thus a plurality of current limiters and LED string drivers 35 may be responsive to a single PWM signal generator 135.

A first end of each LED string 30 is connected to a common output of controllable voltage source 20. A second end of each LED string 30 is connected to one end of current limiter and LED string driver 35 at the drain of the respective FET 40 and to a respective input of multiplexer 190. The source of the respective FET 40 is connected to a first end of the respective sense resistor $R_{sense}$, and the second end of the respective $R_{sense}$ is connected to ground. The first end of the respective $R_{sense}$ is further connected to a first input of the respective comparator 50 of the respective current limiter and LED string driver 35 and to a respective input of multiplexer 190. The gate of each FET 40 is connected to the output of the respective comparator 50 and to a first end of respective pull down resistor 160. A second end of each pull down resistor 160 is connected to a common point.

A second input of each comparator 50 is connected to the output of the respective D/A converter 140 and the enable input of each comparator 50 is connected to the output of the respective PWM signal generator 135. The input of each D/A converter 140 is connected to a respective output of control circuitry 120 and the output of multiplexer 190, which is illustrated as an analog multiplexer, is connected to the input of A/D converter 150, which preferably incorporates a sample and hold circuitry at its input (not shown). The digitized output of A/D converter 150 is connected to a respective input of control circuitry 120, the clocking input of A/D converter 150 is connected to a respective output of control circuitry 120 and the select input of multiplexer 190 is connected to a respective output of control circuitry 120. The output of thermal sensor 180 is connected to a respective input of control circuitry 120 and the output of color sensor 70 is connected to a respective input of control circuitry 120.

Controllable voltage source 20 is shown as being controlled by an output of control circuitry 120, however this is not meant to be limiting in any way and in another embodiment a multiplexed analog feedback loop is utilized.

In operation, control circuitry 120 sets the nominal current through each LED string 30 via the respective D/A converter 140 and the current limiter and LED string driver 35, and in one embodiment initially sets the voltage output of controllable voltage source 20 to a minimum nominal voltage and each of the current limiter and LED string driver 35 to a minimum current setting. The current through each LED string 30 is sensed via a respective sense resistor $R_{sense}$, sampled and digitized via multiplexer 190 and A/D converter 150 and fed to control circuitry 120. Multiplexer 190 is illustrated as an analog multiplexer so as to enable the use of a single A/D converter 150, however this is not meant to be limiting in any way. In other embodiment each sampled current of a respective sense resistor $R_{sense}$ is digitized by an associated A/D converter, and the digital outputs are multiplexed to control circuitry 120.

The voltage drop across each current limiter and LED string driver 35 is sampled and digitized via multiplexer 190 and A/D converter 150 and fed to control circuitry 120. Control circuitry 120 selects a particular one of the LED strings 30, or a function of the LED strings 30, and controls the output of controllable voltage source 20 responsive to an electrical characteristic thereof. In one embodiment a LED string 30 is selected so as to minimize power dissipation, in another embodiment a LED string 30 is selected so as to ensure a precisely matching current in each of the LED strings 30, and in yet another embodiment a function of the LED strings 30 is selected as a compromise between precisely matched currents and minimized power dissipation. Control circuitry 120 further acts to compensate for aging when the PWM duty cycle of respective PWM signal generator 135 has reached a predetermined maximum by modifying the PWM duty cycle of PWM signal generator 135 and/or adjusting the current flow via the respective D/A converter 140.

Control circuitry 120 sets the current limit of the LED strings 30 via the respective D/A converter 140. In particular FET 40, responsive to comparator 50, ensures that the voltage drop across sense resistor $R_{sense}$ is equal to the output of the respective D/A converter 140. Control circuitry 120 further acts to receive the output of color sensor 70, and modify the duty cycle of the respective PWM signal generators 135 so as to maintain a predetermined white point and/or luminance. The PWM duty cycle is operated by the enabling and disabling of the respective comparator 50 under control of the respective PWM signal generator 135 thereby enabling current flow during the active portion of PWM signal 139 and disabling current flow during the inactive portion of PWM signal 139.

The above has been described in an embodiment in which during the inactive portion of PWM signal 139 current flow is disabled, however this is not meant to be limiting in any way. In another embodiment, as described in U.S. Patent Application Publication S/N US 2004/0135522 A1 published Jul. 15, 2004 to Berman et al, the entire contents of which is incorporated by reference, PWM signal 139 is arranged to reduce the current through the LED strings 30 during the inactive portion of PWM signal 139 to a dark current level.

In one embodiment, control circuitry 120 further inputs temperature information from one or more thermal sensors 180. In the event that one or more thermal sensors 180 indicate that temperature has exceeded a predetermined limit, control circuitry 120 acts to reduce power dissipation so as to avoid thermal overload. In yet another embodiment, control circuitry 120 detects an instantaneous change in voltage drop across any of the plurality of current limiter and LED string drivers 35 indicative of short circuit in one or more constituent LEDs of the respective LED strings 30. Control circuitry 120 acts to adjust one or more parameters, including but not limited to adjusting the instantaneous current via D/A converter 140 and adjusting the output of controllable voltage source 20, and/or shut down the short circuited LED string 30 so as to avoid overload and burnout of the respective current limiter and LED string 35 and/or damage to one or more of the LEDs of short circuited LED string 30 and the printed circuit board.

As will be explained further hereinto below in relation to FIGS. 3 and 4, control circuitry 120 polls each of the PWM channels, represented by a LED string 30, in turn. Each LED string 30 may be at any point in time, responsive to the respective PWM signal 139, in one of an active state or an inactive state. During the inactive state no current, or a minimal dark current, is driven through LED string 30, and thus sampling the current through the respective LED string 30, and/or the voltage drop across the respective current limiter and LED string driver 35 is not meaningful. Each sample requires a predetermined time in accordance with the configuration and capabilities of A/D converter 150, and thus sampling all of the PWM channels, and in particular the current through the LED string 30 as represented by the voltage drop across the respective $R_{sense}$, and the voltage drop across the respective current limiter and LED string driver 35, during the inactive state leads to a delay in the sampling of all of the PWM channels. Additionally sampling during the active state of PWM signal 139 is preferably timed so as to ensure stability of voltage drops in the PWM channel responsive thereto, as will be explained further hereinto below.

In accordance with certain embodiments, the PWM channels, represented by LED stings 30, or preferably an identifier associated therewith, are arranged in a round robin queue, a pointer initialized and the settable flags 130 each associated with a particular PWM channel are cleared. Prior to sampling a PWM channel, the state of the respective settable flag 130 and the state of stability signal 137, representing a function of PWM signal 139 output by PWM signal generator 135 associated with the particular channel is first checked, the function being selected to ensure that the voltages to be sampled responsive to PWM signal 139 being active are stable.

In the event that the respective settable flag 130 is set, or stability signal 137 of the PWM signal generator 135 associated with the LED string 30 is not indicative that the PWM signal is active and stable, sampling of the PWM channel is deferred. In the event that the respective settable flag 130 is not set and stability signal 137 of the PWM signal generator 135 associated with the LED string 30 is indicative that the PWM signal is active and stable, the appropriate samples are input to control circuitry 120, and the respective settable flag 130 is set in response. Preferably, the status of stability signal 137 of the PWM signal generator 135 associated with the LED string 30 is confirmed after the sample is taken, and only in the event of confirmation is the respective settable flag 130 set. Once all of the settable flags 130 are set, the settable flags 130 are cleared and the pointer reinitialized. In a preferred embodiment the PWM channels are polled in a round robin order.

Figure 2:
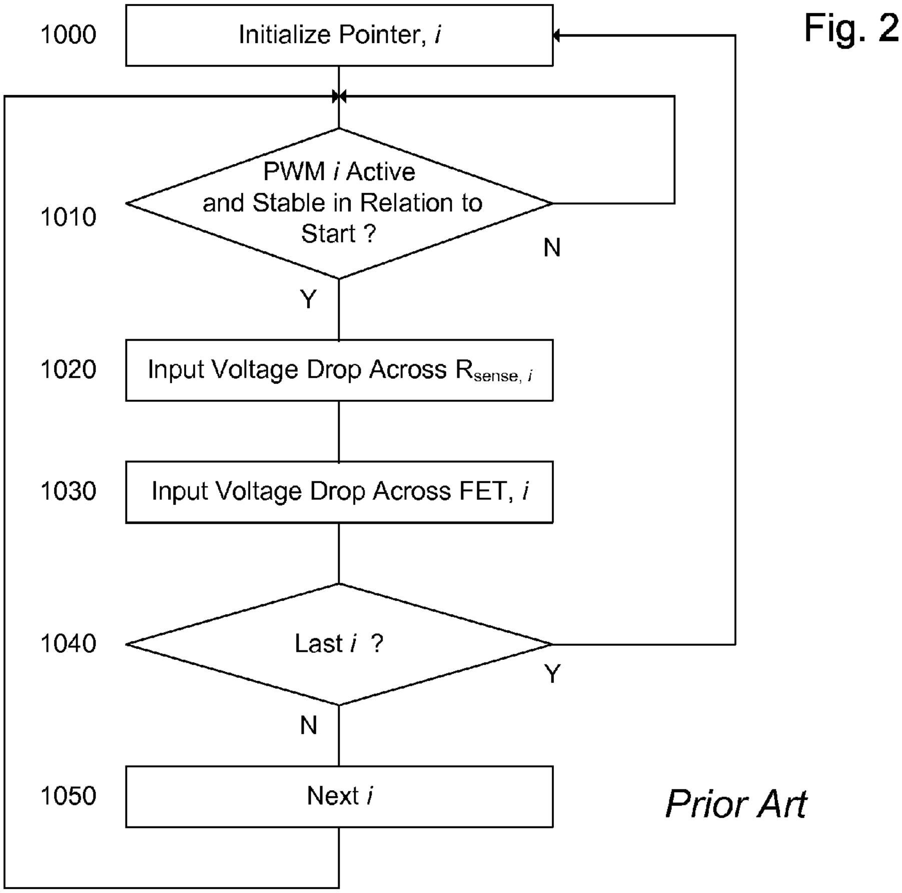
Fig. 2 Prior Art
FIG. 2 illustrates a high level flow chart of the operation of the control circuitry of the LED backlighting system of FIG. 1 according to the prior art.

FIG. 2 illustrates a high level flow chart of the operation of control circuitry 120 of LED backlighting system 10 of FIG. 1 according to the prior art. In stage 1000, a pointer, i, is initialized to point to a first PWM channel, herein represented by a LED string 30. In stage 1010, the status of PWM signal 139 associated with the LED string 30 is checked to ensure that it is active and stable. Stability is determined in accordance with the prior art, by ensuring a predetermined delay from the time PWM signal 139 becomes active. No stability signal 137 is required, as control circuitry 120 builds in a delay from sensing the beginning of the active portion of PWM signal 139. In the event that it is not active, stage 1010 is repeated. Thus, the method of FIG. 2 creates a wait state until PWM signal 139 associated with the pointer, i, is active and stable.

In the event that the PWM signal 139 associated with the LED string 30 is active, in stage 1020 the voltage drop across the respective $R_{sense}$, associated with the LED string 30, i, and representative of the current through LED string 30, i, is input via multiplexer 190 and A/D converter 150. In stage 1030, the voltage drop across current limiter and LED string driver 35, i, representative of the power dissipation there through and changes to which are representative of changes in one or more LEDs of the respective LED string 30, is input via multiplexer 190 and A/D converter 150.

In stage 1040, pointer i is compared with a last pointer. In the event that pointer i points to the last channel, stage 1000 is performed as described above. In the event that pointer i does not point to the last channel, in stage 1050 pointer i is indexed by 1, and stage 1010 as described above, including the inherent wait state, is performed.

Thus, the method of FIG. 2 waits for each PWM channel until the associated PWM signal 139 is active, and polls each PWM channel in turn. Such a method results in delayed sampling of active PWM channels and may further result in starvation of certain PWM channels, particularly when all PWM channels exhibit small duty cycles occurring at the same, or nearly the same, time. An additional difficulty is that the length of the necessary delay from the beginning of the active portion of PWM signal 139 to ensure stability is dependent on controllable voltage source 20, and thus is implementation dependent and can not be determined by design of LED string controller 60.

Figure 3:
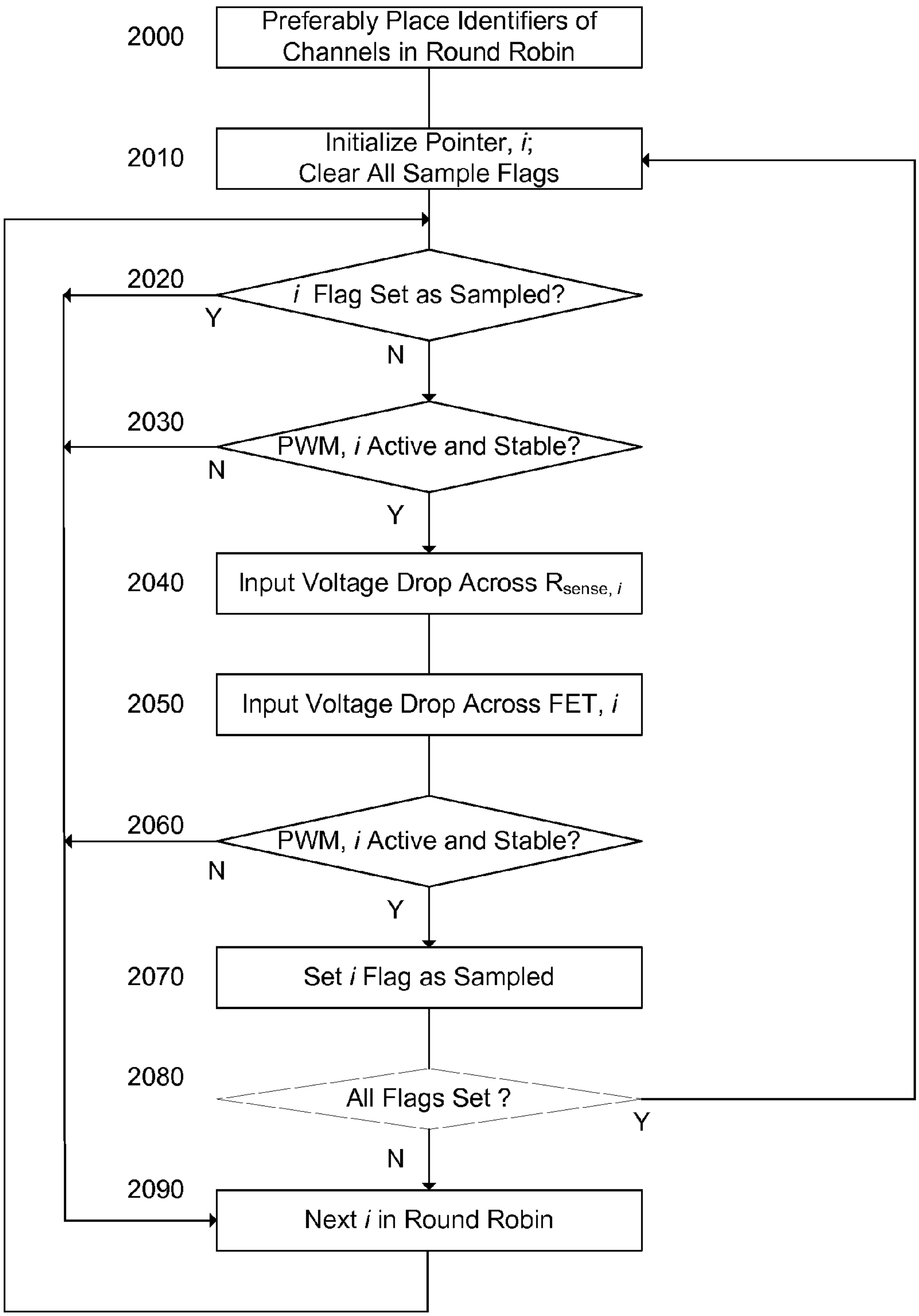
FIG. 3 illustrates a high level flow chart of the operation of the control circuitry of the LED backlighting system of FIG. 1 in accordance with an exemplary embodiment.

FIG. 3 illustrates a high level flow chart of the operation of control circuitry 120 of LED backlighting system 10 of FIG. 1 in accordance with certain embodiments. In stage 2000, the channels, or an indicator thereof, are arranged in a queue, preferably arranged in a round robin. In stage 2010 a pointer i is initialed to point to a first PWM channel of the queue of stage 2000, herein represented by a LED string 30, and all settable flags 130 are cleared.

In stage 2020, the status of settable flag 130, i is checked. In the event that settable flag 130, i is not set, i.e. the PWM channel pointed to by pointer i has not yet been sampled, in stage 2030 the state of stability signal 137 of PWM signal generator 135, i is checked. In the event that stability signal 137 of PWM signal generator 135, i is active, in stage 2040 the voltage drop across $R_{sense}$, i representative of the current through LED string 30, i, is input via multiplexer 190 and A/D converter 150. In stage 2050, the voltage drop across current limiter and LED string driver 35, i, representative of the power dissipation there through and changes to which are representative of changes in one or more constituent LEDs of the respective LED string 30, is input via multiplexer 190 and A/D converter 150. In stage 2060, the state of stability signal 137 of PWM signal generator 135, i is again checked to confirm that the sampling of stages 2040, 2050 above were valid. In the event that stability signal 137 of PWM signal generator 135, i remains active, in stage 2070 settable flag 130, i is set.

In stage 2080, the status of all settable flags 130 are checked. In the event that all settable flags 130 have been set, stage 2010 as described above is performed. In the event that in stage 2080 all settable flags 130 have not been set, in stage 2090 pointer i is indexed to the next channel in the round robin, and stage 2020 as described above is performed.

In the event that in stage 2020, settable flag 130, i is set, i.e. the PWM channel pointed to by pointer i has already been sampled, stage 2090 as described above is performed. In the event that in stage 2030, stability signal 137 of PWM signal generator 135, i is not active, stage 2090 as described above is performed. In the event that in stage 2060, stability signal 137 of PWM signal generator 135, i is not active, stage 2090 as described above is performed.

Figure 4:
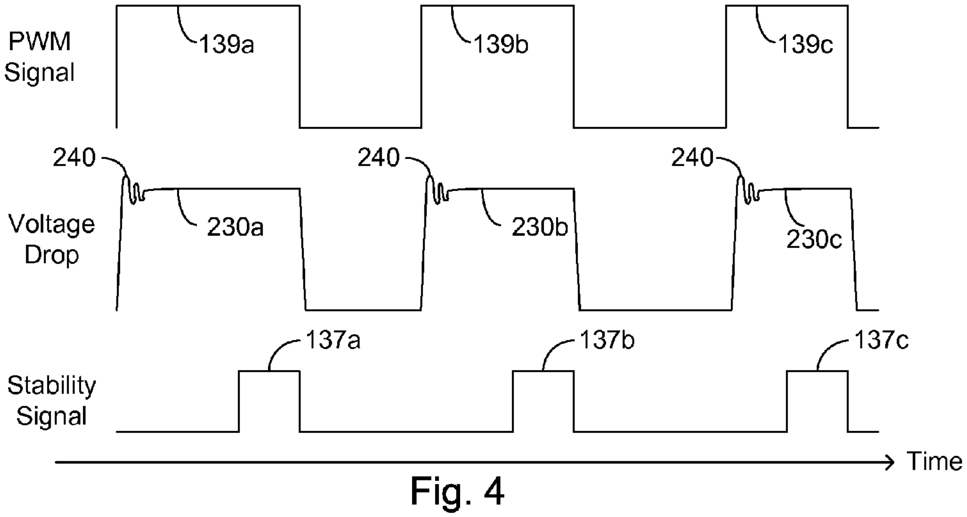
FIG. 4 illustrates the timing of a PWM signal, the resultant voltage drop across an element in the channel and the stability signal in accordance with an exemplary embodiment.

FIG. 4 illustrates the timing of a plurality of PWM signals 139, particularly 139*a*, 139*b* and 139*c* exhibiting three non-equal duty cycles; resultant respective voltage drop waveforms 230 of elements in the PWM channel, particularly respectively 230*a*, 230*b* and 230*c*; and stability signals 137, particularly respectively 137*a*, 137*b* and 137*c*, in accordance with certain embodiments. PWM signal 139*a* exhibits a larger duty cycle than PWM signal 139*b*, and PWM signal 139*b* exhibits a larger duty cycle than PWM signal 139*c*, however this is not meant to be limiting in any way and is for purposes of clarifying certain aspects of a preferred embodiment. PWM signals 139 each enable current flow through a respective LED string 30, which typically exhibits ringing at its leading edge, as shown in ringing waveform 240 exhibited at the leading edge of voltage drop waveforms 230 due the instantaneous change.

Stability signal 137 is a function of PWM signal 139 and is preferably derived by predicting the end of the respective PWM duty cycle. In one embodiment, stability signal 137 is active for a predetermined time period ending substantially coincidentally with the end of the active portion of PWM signal 139. In another embodiment, stability signal 137 is active for a predetermined time period in relation to the end of the active portion of PWM signal 139. The length of the predetermined time period in either embodiment is primarily dependent of the sampling speed and set up time of A/D converter 150 in cooperation of multiplexer 190. Stability signal 137 is thus active coincidental with voltage drop waveform 230 being substantially stable. Advantageously, stability signal 137 exhibits timing in relation to the end of PWM signal 139, as opposed to timing in relation to the beginning of PWM signal 139 of the prior art. Timing in relation to the end of PWM signal 139 maximizes the distance from ringing waveform 240, enabling timing to be set irrespective of the implementation of controllable voltage source 20.

Thus, embodiments hereof enable a method and system for rapidly and consistently sampling an electrical condition of each of a plurality of independent PWM driven channels. Identifiers of the PWM driven channels are arranged in a queue and polling is done in a round robin of the queue. A plurality of settable flags, each associated with a particular PWM driven channel, is defined and a pointer is set to the first channel in the queue.

Prior to sensing the electrical condition of a particular channel in the queue, the status of the both the respective settable flag and the PWM driving signal is checked. In the event that the settable flag is not set, i.e. the PWM channel has not been sampled, and the driving signal is active and the channel is stable, i.e. current is flowing stably through the PWM channel, the electrical condition is sampled and the respective settable flag is set. In the event that either the settable flag is set, i.e. the PWM channel has been sampled, or the driving signal is not active, or the current is not stably flowing through the PWM channel, the channel is skipped and the next channel in the queue, for which the settable flag is not set and the PWM signal is active and the channel is stable, is sampled.

Thus, an active stable PWM channel is quickly found and sampled, avoiding a situation of starvation of certain PWM channels when all PWM channels exhibit small duty cycles occurring at the same, or nearly the same, time. The routine continues until all channels in the queue have been sampled and the respective settable flags have all been set. The settable flags are then all cleared, and the pointer reset to the first channel in the queue.

The above has been described in relation to an embodiment in which the channels are driven with a PWM signal, however this is not meant to be limiting in any way, and is equally applicable to other modulation techniques including, but not limited to, pulse density modulation.

It is appreciated that certain features, which are, for clarity, described in the context of separate embodiments, may also be provided in combination in a single embodiment. Conversely, various features which are, for brevity, described in the context of a single embodiment, may also be provided separately or in any suitable subcombination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description and which are not in the prior art.

We claim:

1. An automated method of sampling an electrical condition of each of a plurality of channels so as to rapidly sample all of the plurality of channels, the method comprising:

driving each of the plurality of channels with a modulated signal;

providing a settable flag associated with each of the plurality of channels;

selecting one of the plurality of channels;

identifying if said settable flag associated with said selected one of the plurality of channels is set;

in the event that said settable flag associated with said selected one of the plurality of channels is not set, and said modulated signal of said selected one of the plurality of channels is active:

sampling an electrical condition of said selected one of the plurality of channels; and setting said provided settable flag associated with said selected one of the plurality of channels;

in the event that either said settable flag associated with said selected one of the plurality of channels is set or said modulated signal of said selected one of the plurality of channels is not active, selecting a next one of the plurality of channels; and clearing, only in the event that all of said plurality of settable flags have been set, all of said plurality of settable flags, thereby rapidly completing the sampling of all of the plurality of channels.

2. An automated method according to claim 1, wherein said of said modulated signal being active further comprises said modulated signal being stably driven through said selected one of the plurality of channels.

3. An automated method according to claim 1, wherein said modulated signal is a pulse width modulated signal, said method further comprising:

providing a plurality of pulse width modulation generators; and associating each of the plurality of channels with a particular one of said provided pulse width modulation generators, said driving of each of the plurality of channels with said pulse width modulated signal being responsive to said provided pulse width modulation generator associated therewith.

4. An automated method according to claim 1, further comprising subsequent to said sampling and prior to said setting said provided settable flag:

confirming if said modulated signal of said selected one of the plurality of channels remains active, said setting of said provided settable flag associated with said selected one of said channels being only if said modulated signal of said selected one of the plurality of channels is confirmed as active.

5. An automated method according to claim 1, wherein said electrical condition comprises an indication of current through the selected one of the plurality of channels.

6. An automated method according to claim 1, further comprising:

providing for each of the plurality of channels a current limiter arranged to limit current through the driven channel, wherein said electrical condition comprises a voltage drop across said current limiter.

7. An automated method according to claim 1, wherein each of said provided plurality of channels comprises a light emitting diode string.

8. A circuitry for sampling an electrical condition of a plurality of channels, the circuitry comprising:

a control circuitry;

a plurality of modulated signal generators in communication with said control circuitry, each of said modulated signal generators outputting a modulated signal and a function of said modulated signal;

a plurality of settable flags in communication with said control circuitry; and a plurality of channel drivers, each of said plurality of channel drivers responsive to, and associated with, a particular one of said plurality of modulated signal generators and arranged to drive a particular one of the plurality of channels responsive to said respective modulated signal, said control circuitry arranged to:

associate each of said channel drivers with a particular one of said plurality of settable flags;

select one of said plurality of channel drivers;

identify, if said settable flag associated with said selected one of said plurality of channel drivers is set;

in the event said settable flag associated with said selected one of said plurality of channel drivers is not set, and said function of said modulated signal associated with said selected one of said plurality of channel drivers is indicative that said modulated signal associated with said selected one of said plurality of channel drivers is active:

sample an electrical condition of one of said selected one of said plurality of channel drivers and the particular channel associated therewith; and set said settable flag associated with said selected one of said plurality of channel drivers;

in the event that either said settable flag associated with said selected one of said plurality of channel drivers is set or said function of said modulated signal associated with said selected one of said plurality of channel drivers is indicative that said modulated signal associated with said selected one of said plurality of channel drivers is not active, select a next one of said plurality of channel drivers; and clear, only in the event that all of said plurality of settable flags have been set, all of the plurality of settable flags, thereby rapidly completing the sampling of all of the plurality of channels.

9. A circuitry according to claim 8, wherein said control circuitry is further arranged subsequent to said sampling of said electrical condition and prior to said setting said settable flag, to confirm that said function of said modulated signal associated with said selected one of said plurality of channel drivers is indicative that said modulated signal associated with said selected one of said plurality of channel drivers remains active, said setting of said settable flag associated with said selected one of said plurality of channel drivers being only if said function of said modulated signal associated with said selected one of said plurality of channel drivers is indicative that said modulated signal associated with said selected one of said plurality of channel drivers confirmed as active.

10. A circuitry according to claim 8, wherein said plurality of modulated signal generators are pulse width modulation generators and said modulated signals of said pulse width modulation generators are pulse width modulated signals.

11. A circuitry according to claim 8, wherein said electrical condition comprises an indication of current through the particular channel.

12. A circuitry according to claim 8, wherein each of said plurality of channel drivers comprises a current limiter, and wherein said electrical condition comprises a voltage drop across said current limiter.

13. A circuitry according to claim 8, wherein each of said plurality of channels comprises a light emitting diode string.

14. A circuitry according to claim 8, wherein said function of said modulated signal comprises a signal condition lasting a predetermined time period, said signal condition ending substantially coincident with the end of an active portion of said modulated signal.

15. A circuitry according to claim 8, wherein said function of said modulated signal comprises a signal condition lasting a predetermined time period in relation to the end of an active portion of said modulated signal.

16. A circuitry according to claim 8, wherein said function of said modulated signal being active comprises a signal condition indicative that current is being stably driven through said selected one of said plurality of channel drivers.

17. A light emitting diode (LED) string driver comprising:

a control circuitry;

a plurality of pulse width modulated electrical signals in communication with said control circuitry;

a plurality of settable flags in communication with said control circuitry; and a plurality of LED string drivers, each of said plurality of LED string drivers responsive to, and associated with, a particular one of said plurality of pulse width modulated electrical signals, said control circuitry arranged to:

associate each of said plurality of LED string drivers with a particular one of said settable flags;

select one of said plurality of LED string drivers;

identify, if said settable flag associated with said selected one of said plurality of LED string drivers is set;

identify, in the event said settable flag associated with said selected one of said plurality of LED string driver is not set, if said pulse width modulated electrical signal associated with said selected one of said plurality of LED string drivers is active and stable;

in the event said settable flag associated with said selected one of said plurality of LED string driver is not set and said pulse width modulated electrical signal associated with said selected one of said plurality of LED string drivers is active and stable:

sample an electrical condition of said selected one of said plurality of LED string drivers and the particular channel associated therewith; and set said settable flag associated with said selected one of said plurality of LED string drivers;

in the event that either:

said settable flag associated with said selected one of said plurality of LED string drivers is set; or said pulse width modulated signal associated with said selected one of said plurality of LED string drivers is not active and stable:

select a next one of said plurality of LED string drivers; and clear, only in the event that all of said plurality of settable flags have been set, all of said plurality of settable flags, thereby rapidly completing the sampling of all of said plurality of LED string drivers.

18. A light emitting diode string driver according to claim 17, further comprising a plurality of pulse width modulated generators each generating a respective one of said plurality of pulse width modulated signals and in communication with said control circuitry, each of said pulse width modulated generators further outputting to said control circuitry a stability signal indicative of a predetermined time period ending substantially coincidentally with the end of the active portion of said pulse width modulated electrical signal, said stability signal indicating that said LED string driver is active and stable.

19. A light emitting diode string driver according to claim 17, further comprising a plurality of pulse width modulated generators each generating a respective one of said plurality of pulse width modulated signals and in communication with said control circuitry, each of said pulse width modulated generators further outputting to said control circuitry a stability signal indicative of a predetermined time period in relation to the end of the active portion of said pulse width modulated electrical signal, said stability signal indicating that said LED string driver is active and stable.

* * * * *